(12) United States Patent
Lee et al.

(10) Patent No.: US 7,225,524 B2
(45) Date of Patent: Jun. 5, 2007

(54) METHOD FOR FABRICATING A GYROSCOPE

(75) Inventors: Moon-chul Lee, Seongnam-si (KR); Hyung Choi, Seongnam-si (KR); Seok-jin Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 97 days.

(21) Appl. No.: 11/002,241

(22) Filed: Dec. 3, 2004

(65) Prior Publication Data

US 2005/0132798 A1 Jun. 23, 2005

(30) Foreign Application Priority Data

Dec. 17, 2003 (KR) ...................... 10-2003-0092278

(51) Int. Cl.
*H04R 31/00* (2006.01)
(52) U.S. Cl. ...................... 29/594; 29/592.1; 29/602.1; 73/503.3; 73/504.02; 74/5 R; 74/5.4; 216/62; 216/66; 216/67; 451/5; 451/41
(58) Field of Classification Search ............... 29/592.1, 29/594; 73/503.3, 504.02; 74/5 R, 5.4; 216/62, 66, 67; 451/5, 41
See application file for complete search history.

(56) References Cited

U.S. PATENT DOCUMENTS

| | | | |
|---|---|---|---|
| 6,125,700 A | 10/2000 | Tsugai et al. | |
| 6,872,319 B2 * | 3/2005 | Tsai | ............... 216/2 |
| 2001/0002551 A1 | 6/2001 | Kawai et al. | |
| 2004/0060898 A1* | 4/2004 | Tsai | ............... 216/2 |

FOREIGN PATENT DOCUMENTS

| | | |
|---|---|---|
| DE | 101 43 968 A1 | 4/2002 |
| EP | 1 014 094 A1 | 6/2000 |
| EP | 1 118 836 A2 | 7/2001 |
| WO | WO 02/051743 A2 | 7/2002 |

OTHER PUBLICATIONS

"A silicon wafer dissolved vibrating gyroscope"; Yao Yahong; Gao Zhongyu; Zhang Rong; Dong Yuqian; Chen Zhiyong; Instrumentation and Measurement Technology Conference, 1998. IMTC/98. Conference Proceedings. IEEE vol. 2; May 18-21, 1998; pp.: 1133-1136.*

* cited by examiner

*Primary Examiner*—Paul D. Kim
(74) *Attorney, Agent, or Firm*—Sughrue Mion, PLLC

(57) ABSTRACT

Method for fabricating a gyroscope including: fabricating a SMS wafer where a first wafer, a metal film, and a second wafer are sequentially stacked; forming a cantilever or a bridge shaped-structure on the relevant portion of the first wafer through the photolithography process; attaching to the surface of the first wafer, a first cap made of glass and having a predetermined space for sealing the movable structure in a vacuum state; separating and removing the metal film and the second wafer from the first wafer; and attaching to the backside of the first wafer, the second cap which is structurally and materially symmetric to the first cap. The SMS wafer is fabricated by depositing the metal film on the second wafer and bonding the first wafer on the metal film using metal paste or material of polymer series. With lower material costs, improvements in performance and characteristics can be achieved.

9 Claims, 5 Drawing Sheets

METHOD FOR FABRICATING A GYROSCOPE

This application claims benefit under 35 U.S.C. § 119 from Korean Patent Application No. 2003-92278, filed on Dec. 17, 2003, the entire content of which is incorporated herein by reference.

BACKGROUND OF THE INVENTION

1. Field of the Invention

The present invention relates to a method for fabricating a gyroscope and particularly, to a method for fabricating a gyroscope using an SMS (Si-Metal-Si) wafer and a gyroscope fabricated by the same.

2. Description of the Related Art

A gyroscope is generally known as a sensor for measuring an angular velocity of a moving object, and it plays a very important role in an inertial navigation system for measuring posture and location of moving objects such as vessels, airplanes, missiles, etc.

Recently, a micro gyroscope using the MEMS (Micro Electro Mechanical System) technology has become available with small size, high sensitivity, and low price. The micro gyroscope is used for various applications including automobiles, electronic appliances, and information telecommunications.

The micro gyroscope operates in the following way in which: when a 2-degree-of-freedom movable structure in x, y directions, being applied with electrostatic force in a lateral direction, is given rotational force with a vertical rotational axis (z direction), Coriolis force of up-and-down direction (y direction) is applied to the movable structure, whereby the movable structure is vibrated in an up-and-down direction, and the sensor circuit detects an amount of vibration in units of capacitance. The movable structure is vibrated in a vacuum state to facilitate the vibration of the movable structure using a low voltage and improve sensitivity.

In the meantime, the movable structure, which is a principle element of the micro gyroscope, may comprise a cantilever with one part being spaced away from a substrate and a bridge forming a space by floating above a central portion while fixed at both ends of the substrate. In forming the movable structure, a method of etching of a sacrificial layer is used. For a sacrificial layer, an oxidation film having a large etching selective ratio with respect to silicon, is used.

FIG. 1A through FIG. 1D illustrate the general structure of the micro gyroscope and fabricating method thereof. In the drawings, the reference numerals 10, 20, 30 represent a semiconductor wafer, a movable structure, a cap, respectively.

For the semiconductor wafer 10, an SOI (Si On Insulator) wafer, such as a SOI wafer comprising an oxidation film 13 of a predetermined thickness interposed between a first wafer 11 and a second wafer 12 as shown in FIG. 1A, is used, which is considerably expensive.

A first step for fabricating the micro gyroscope comprises preparing or fabricating the semiconductor wafer 10 having the foregoing structure, and a second step comprises forming the movable structure 20 on the relevant portion of the semiconductor wafer 10.

The movable structure 20 is formed by patterning the relevant portion of the first wafer 11 of the semiconductor wafer 10 through the photolithography process and performing dry etching process. One example of the movable structure 20 formed by such process is shown in FIG. 1B.

After the movable structure 20 is formed, the process for wet etching of the relevant portion of the oxidation film 13 is performed to float the movable structure 20 above from the semiconductor wafer 10, as shown in FIG. 1C.

Finally, as shown in FIG. 1D, the cap 30 is anodic-bonded on the upper part of the semiconductor wafer 10 so that the movable structure 20 is sealed, whereby the portion where the movable structure 20 is situated becomes vacuum. The cap 30 is made of glass.

However, the foregoing method for fabricating the general micro gyroscope has the problems as follows and problem-solving is required.

Firstly, since the high priced SOI wafer is used, fabricating cost is increased.

Secondly, since the oxidation film 13 is used for a sacrificial layer, an undesirable notch 41 (FIG. 1B) is generated at the terminals of the movable structure 20 from the dry etching process of the first wafer 11 for formation of the movable structure 20, and also an undesirable undercut 42 (FIG. 1C) is generated from the wet etching process of the oxidation film 13 for floating the movable structure 20. Furthermore, the agglutination phenomenon is generated during the wet etching processing in which the movable structure 20 sticks to the second wafer 12. Such agglutination phenomena are usually generated during the process for anodic-bonding the sealing cap 30, and the notch 41, the undercut 42, and the agglutination phenomenon not only generate deterioration in the characteristics and performance of the gyroscope, but also cause reduction in product yield.

Thirdly, since materials of the semiconductor wafer 10 and the cap 30 are different from each other, stress due to the difference in thermal expansion coefficient is generated, and therefore, the structure gets unstable.

SUMMARY OF THE INVENTION

The present invention has been developed in order to solve the above drawbacks and other problems associated with the method for fabricating the general micro gyroscope. Therefore, an aspect of the present invention is to provide a method for fabricating a gyroscope, capable of reducing fabricating costs by using the general silicon wafer whose price is cheap.

It is another aspect of the present invention to provide a method for fabricating a gyroscope, capable of resolving fundamentally a notch, an undercut and agglutination problems that have been generated due to general use of the oxidation film, by using a metal film as a barrier to etching.

It is still another aspect of the present invention to provide a gyroscope fabricated according to the above method.

The foregoing and other aspects and advantages are substantially realized by providing a method for fabricating a gyroscope according to the present invention, which comprises the steps of: fabricating a SMS wafer having a construction in which a first wafer and a second wafer are attached to both sides of a metal film; forming a movable structure that is possibly moving, on the first wafer; attaching to a first surface of the first wafer, a first cap having a predetermined space, for sealing the movable structure; separating the metal film and the second wafer from the first wafer and removing the same; and attaching to a second surface of the first wafer, a second cap having a structure symmetric with respect to the first cap.

The step of fabricating the SMS wafer comprises the steps of: preparing a second wafer of a predetermined thickness; forming a metal film on the second wafer; bonding a first wafer on the metal film of the second wafer using a metal paste; and grinding the first wafer in a thickness of a movable structure to be formed, through a CMP process (Chemical Mechanical Polishing). Here, the first and the second wafers are all general silicon wafers of low price. Therefore, the material costs can be reduced in comparison with the case of the SOI wafer being used.

Also, the step of forming the movable structure comprises the steps of: patterning the relevant portion of the first wafer through the photolithography process; and dry etching the patterned portion. Here, since the metal film of the SMS wafer is used as a barrier for the dry etching, any notch or undercut whatsoever is not generated at the boundary.

The first and the second caps are anodic-bonded, respectively, and made of glass. Since those caps are in symmetric relation with each other, a structurally stable gyroscope can be realized.

Also, the step of separating the metal film and the second wafer includes the sulfuric-acid-cleaning process.

In the meantime, the metal film comprises a buffer layer and a metal layer. For the buffer layer, TiN or Ti can be used and for the metal layer, Al or Au can be used.

The gyroscope to achieve the above aspects of the present invention is characterized in that the movable structure is movable and made of silicon, the first and the second caps made of glass and having a space for sealing the movable structure in a vacuum state, are arranged on both sides of the movable structure.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE EXEMPLARY EMBODIMENTS

Figure 1A:
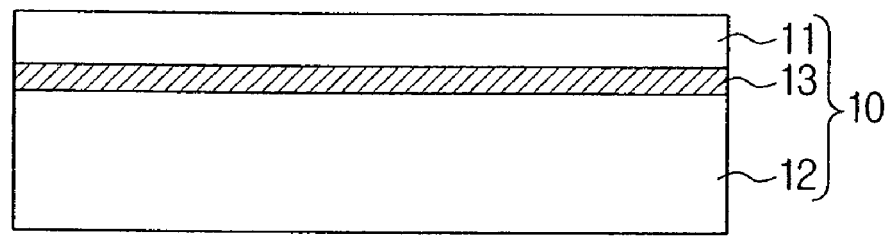
FIG. 1A through FIG. 1D are views of the conventional fabricating process for the gyroscope.

Certain embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

In FIG. 2A through FIG. 2G, the reference numeral 100 represents the SMS (Si-Metal-Si) semiconductor wafer, which is one of the characteristic parts of the present invention. Unlike the conventional SOI (Si-On-Insulator) semiconductor wafer, the SMS semiconductor wafer 100 uses a wafer which has a metal film between two sheets of silicon wafer that is relatively cheap.

Figure 2A:
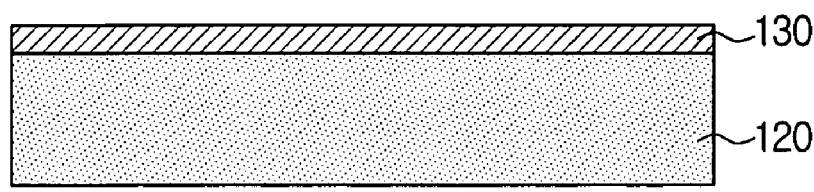
FIG. 2A through FIG. 2G are views of the fabricating process for the gyroscope according to the present invention.
Figure 2B:
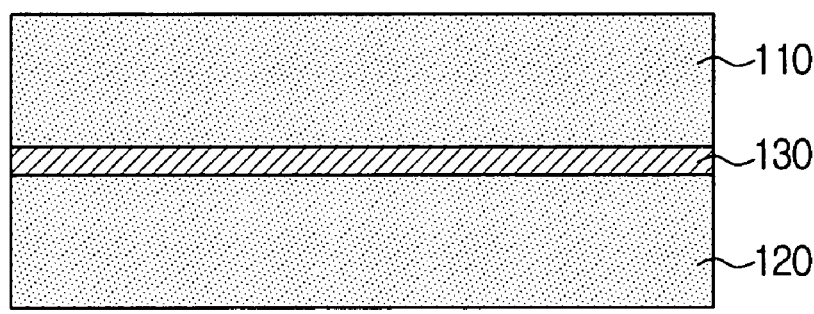
Figure 2C:
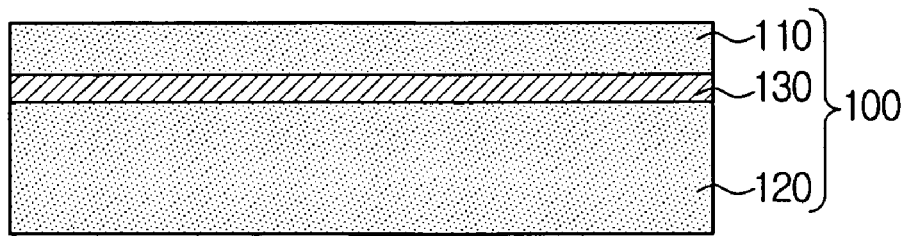

The first step in the method for fabricating the gyroscope according to the present invention, comprises preparing or fabricating the SMS semiconductor wafer 100. As shown in FIG. 2A through FIG. 2C, the fabrication of the SMS semiconductor wafer 100 is performed in the following way, in which: first, a metal film 130 having a thickness of about 1 μm is formed on the second wafer 120 having a thickness of about 500 μm; and a first wafer 110 having the about same thickness as the second wafer 120 is attached on the metal film 130 using a material such as a metal paste or polymer series; thereafter, the thickness of the first wafer 110 is processed so that it has the same thickness as the movable structure to be formed.

Here, the first and the second wafers 110 and 120 are silicon wafers of low price that are generally used in the semiconductor process. The metal film 130 includes a metal layer 130a and a buffer layer 130b, as shown in FIG. 2H. The metal film 130 is formed by sequentially depositing the buffer layer and the metal layer on the surface of the second wafer 120. For the metal layer, Al or Au can be used, and for the buffer layer, TiN or Ti can be used. Here, the buffer layer is designed to promote adhesion of the metal layer and the second wafer 120. In the meantime, processing of the first wafer 110 comprises the lapping process and the CMP (Chemical Mechanical Polishing) process.

Figure 1B:
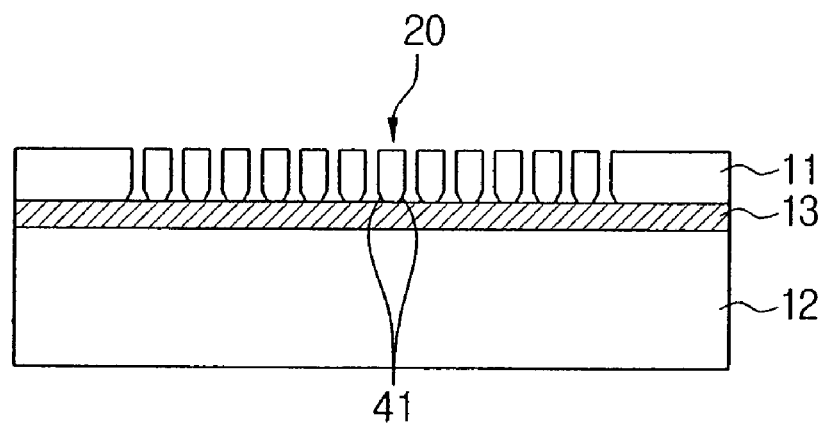
Figure 1C:
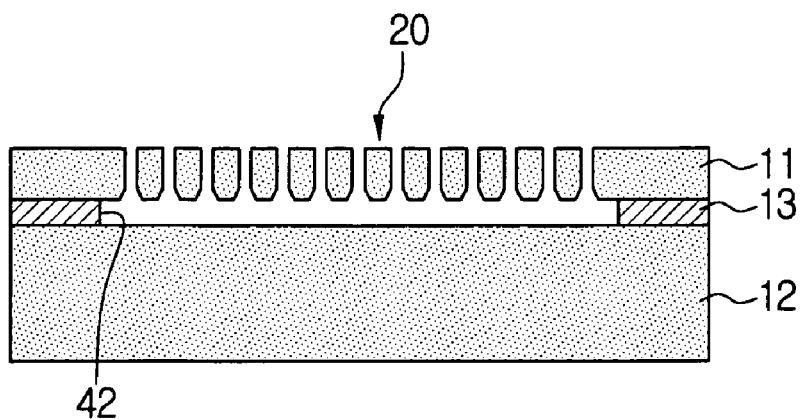
Figure 1D:
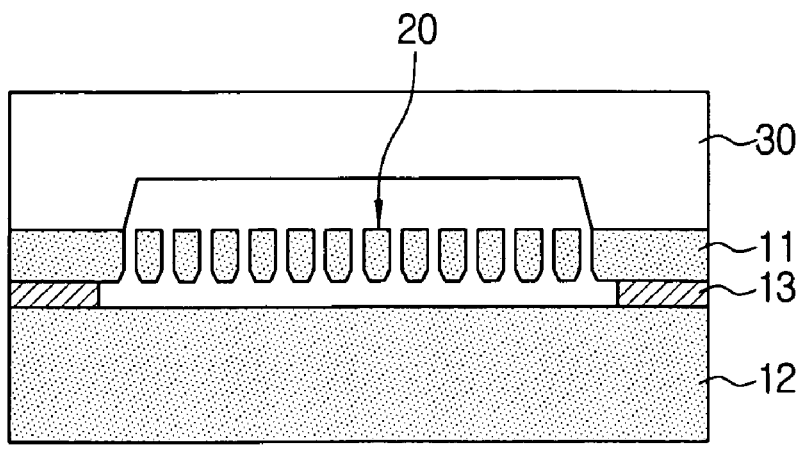
Figure 2D:
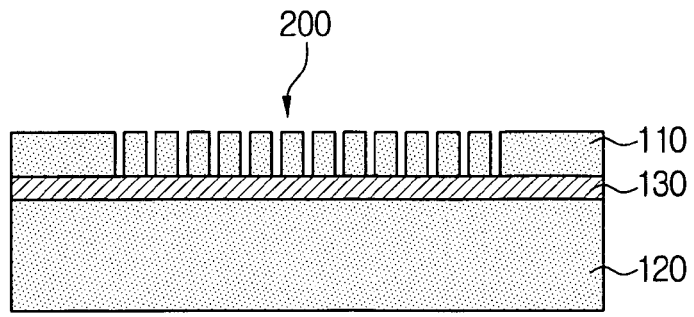

After the SMS semiconductor wafer 100 is fabricated in the foregoing manner, the movable structure 200 is formed as shown in FIG. 2D. The movable structure 200 is formed in such a way that the relevant portion of the first wafer 110 of the semiconductor wafer 100 is patterned through the photolithography process, and for example, the relevant portion is patterned in the form of a plurality of electrodes as shown in the drawing. Thereafter, the dry etching process is performed with the patterned photoresister used for a mask and the metal film 130 of the semiconductor wafer 100 used as a barrier for the etching. In the conventional method, since the oxidation film is used for a sacrificial layer, ion is reflected from the oxidation film upon the etching process, and an unnecessary notch 41 (refer to FIG. 1B) is generated at the terminal of the movable structure realized by the etching process. But, according to the present invention, since the metal film 130 is used as a barrier for the etching, such ion reflection is not generated and notching generation can be prevented.

Figure 2E:
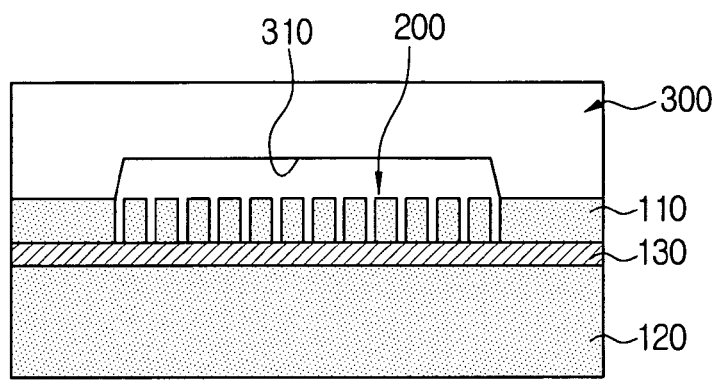

After the movable structure 200 is formed, as shown in FIG. 2E, a first cap 300 made of glass, and having a predetermined space 310 for sealing the movable structure 200, is attached on the upper surface of the first wafer 110 having the movable structure 200. The first cap 300, together with a second cap which will be described below, is designed to seal the movable structure 200 to make into a high vacuum state the portion in which the movable structure 200 is positioned. Such first cap 300 is attached to the first wafer 110 by anodic-bonding.

Figure 2F:
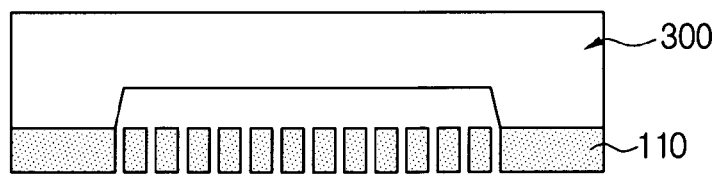

Thereafter, the metal film 130 and the second wafer 120 that are supporting the movable structure 200 are removed, whereby the movable structure 200 is floated so that it may be movable. Such process can be easily performed by means of the cleaning with sulfuric acid. FIG. 2F shows a state where the metal film 130 and the second wafer 120 are removed.

Figure 2G:
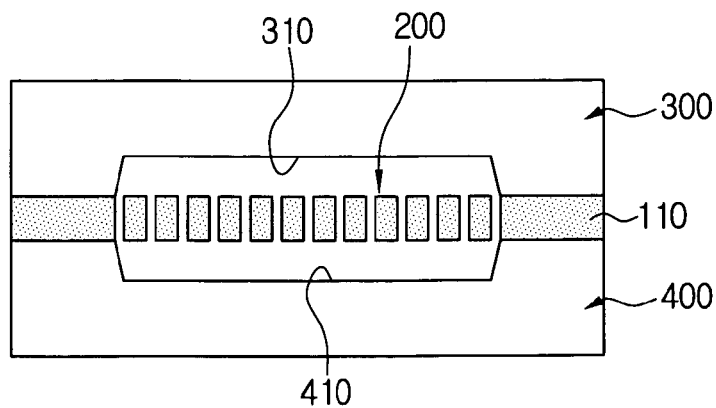
Figure 2H:
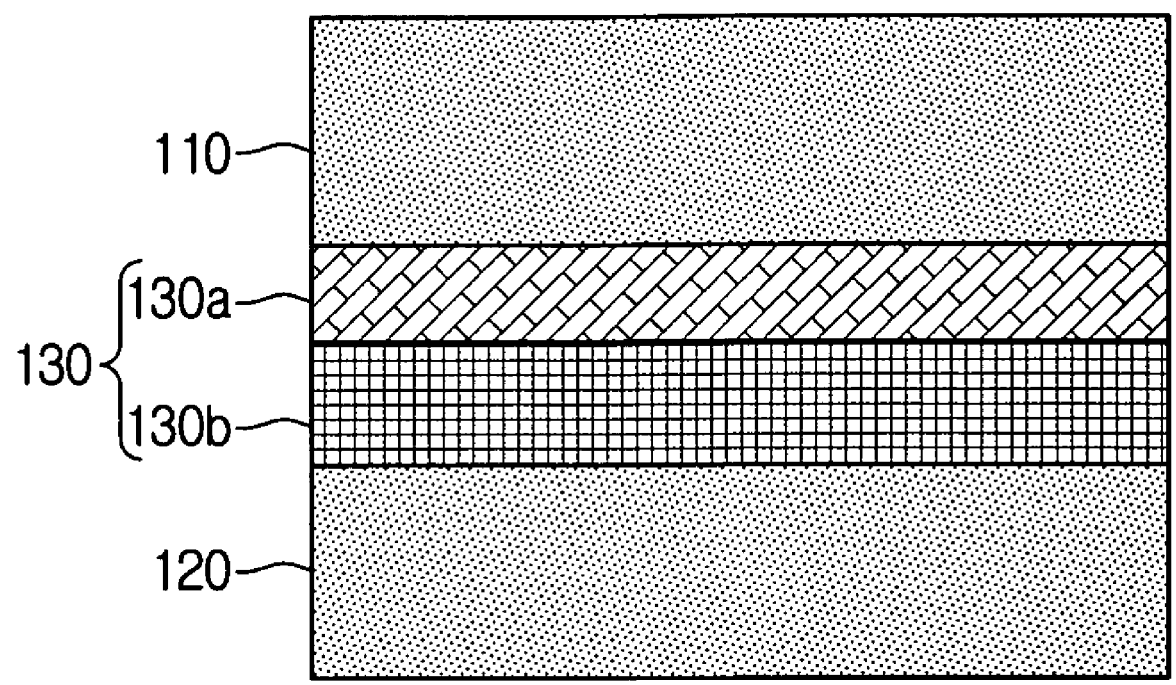
FIG. 2H is a view of a metal film used in the fabricating process for the gyroscope according to the present invention.

Next, the second cap 400, which is in a symmetric relation structurally and materially, with respect to the first cap 300, is attached to the opposite side of the first wafer 110 by anodic-bonding. As a result, a gyroscope structure as shown in FIG. 2G is formed in which the movable structure 200 is situated in the space formed by the spaces 310 and 410 of the first and the second caps 300 and 400. Here, the space where the movable structure 200 is situated is maintained in a vacuum state, whereby the movable structure 200 can be operated even with a low voltage, and have increased sensitivity.

As described above, since the movable structure 200 is formed by performing dry etching with the metal film 130 used as a barrier for the etching, notch generation in the movable structure 200 can be prevented. Also, instead of using the method for floating the movable structure by wet etching the conventional oxidation film, the method for floating the movable structure by removing the metal film 130 and the second wafer 120 is used, therefore, the undercut problem or the agglutination phenomenon wherein the movable structure sticks on the upper or the lower member, which would otherwise occur frequently, is prevented. Also, since the first and the second caps 300 and 400 are arranged in a materially symmetric relation on both sides with the movable structure 200 made of silicon interposed therebetween, the stress generation problem due to difference in thermal expansion coefficient, which would otherwise occur frequently, can be prevented.

According to the present invention described in the foregoing, since the notch in the movable structure, the undercut, and the agglutination phenomenon are not prevented, improvements in characteristics and performance of the gyroscope can be achieved and also defective product generation can be remarkably reduced, and fractional yield can be improved.

Further, since the first and the second caps for sealing the movable structure in a vacuum state form a materially symmetric structure, the gyroscope of a highly stable structure can be realized.

Still further, since the general silicon wafer is used instead of the high priced SOI wafer, the material costs can be cut down.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method for fabricating a gyroscope comprising:
   a) fabricating a Si-Metal-Si (SMS) wafer having a construction in which a first wafer and a second wafer are attached to both sides of a metal film;
   b) forming a movable structure in the first wafer;
   c) attaching to a first surface of the first wafer, a first cap having a predetermined space at the bottom of the first cap;
   d) separating and removing the metal film and the second wafer from the first wafer; and
   e) attaching to a second surface of the first wafer, a second cap having a structure symmetric with respect to the first cap.

2. The method as claimed in claim 1, wherein a) comprises:
   a1) forming the metal film on the second wafer of a predetermined thickness;
   a2) bonding the first wafer on the metal film using a metal paste; and
   a3) grinding the first wafer into a thickness of the movable structure to be formed, through a Chemical Mechanical Polishing (CMP) process.

3. The method as claimed in claim 1, wherein the b) comprises:
   b1) patterning a predetermined portion of the first wafer through a photolithography process to form a patterned portion; and
   b2) dry-etching the patterned portion with the metal film used as a barrier of etching.

4. The method as claimed in claim 1, wherein the first and the second caps are anodic-bonded.

5. The method as claimed in claim 1, wherein the d) comprises a sulfuric-acid-cleaning process.

6. The method as claimed in claim 2, wherein the a3) comprises a lapping process.

7. The method as claimed in claim 2. wherein the metal film comprises a buffer layer and a metal layer.

8. The method as claimed in claim 1, wherein the predetermined space is a cavity formed by a hollow portion of the first cap and a hollow portion of the second cap for sealing the moveable structure.

9. The method as claimed in claim 1, wherein one side of the both sides of the metal film is opposite to the another of the both sides of the metal film.

* * * * *